US012588444B2

(12) United States Patent
Liu et al.

(10) Patent No.: US 12,588,444 B2
(45) Date of Patent: Mar. 24, 2026

(54) METHOD FOR FORMING A SEMICONDUCTOR STRUCTURE

(71) Applicant: United Semiconductor (Xiamen) Co., Ltd., Xiamen (CN)

(72) Inventors: Jian Liu, Xiamen (CN); Chen Chen, Singapore (SG); Chin-Chun Huang, Hsinchu County (TW); Wen Yi Tan, Xiamen (CN); Jinjian Ouyang, Xiamen (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 409 days.

(21) Appl. No.: 18/379,678

(22) Filed: Oct. 13, 2023

(65) Prior Publication Data

US 2025/0095994 A1 Mar. 20, 2025

(30) Foreign Application Priority Data

Sep. 19, 2023 (CN) .......................... 202311210237.8

(51) Int. Cl.
*H01L 21/266* (2006.01)
*H01L 21/762* (2006.01)

(52) U.S. Cl.
CPC ...... *H01L 21/266* (2013.01); *H01L 21/76224* (2013.01)

(58) Field of Classification Search
CPC ........................ H01L 21/266; H01L 21/76224
See application file for complete search history.

(56) References Cited

U.S. PATENT DOCUMENTS 9,929,056 B1 * 3/2018 Tsai ................... H10D 84/0144
2021/0272811 A1 * 9/2021 Ji ........................... H01L 21/266

* cited by examiner

*Primary Examiner* — Ratisha Mehta
(74) *Attorney, Agent, or Firm* — Winston Hsu

(57) ABSTRACT

The present invention uses the thinned second pad oxide layer as the pad oxide layer for the subsequent shallow trench isolation process. Therefore, it is not necessary to remove the entire pad oxide layer on the substrate surface after the P-type high-voltage ion well thermal drive-in process. The subsequent step of re-growing the pad oxide layer is omitted, thereby simplifying the process complexity.

7 Claims, 2 Drawing Sheets

METHOD FOR FORMING A SEMICONDUCTOR STRUCTURE

BACKGROUND OF THE INVENTION

1. Field of the Invention

The present invention relates to the field of semiconductor technology, and in particular, to a method of forming a semiconductor structure.

2. Description of the Prior Art

Embedded high-voltage (eHV) technology compatible with logic CMOS processes has been used to manufacture various display driver ICs including liquid crystal display (LCD) driver ICs and organic light-emitting diode (OLED) display driver ICs.

In the existing embedded high-voltage process, after completing the annealing process of the ion well in the high-voltage device area, the oxide liner layer formed on the substrate surface in the low-voltage device area, medium-voltage device area and high-voltage device area will be completely removed, and in the subsequent shallow trench insulation process, a new pad oxide layer and a pad nitride layer need to be formed, making the steps more complex.

SUMMARY OF THE INVENTION

It is one object of the present invention to provide a method for forming a semiconductor structure to solve the deficiencies or shortcomings of the prior art.

One aspect of the invention provides a method for forming a semiconductor structure. A substrate having a first device region and a second device region thereon is provided. A first pad oxide layer is formed on the substrate over the first device region and the second device region, wherein the first pad oxide layer has a first thickness. A nitride hard mask layer is formed on the first pad oxide layer over the first device region and the second device region. The nitride hard mask layer is removed from the second device region. A second pad oxide layer is thermally grown on the substrate within the second device region, wherein the second pad oxide layer has a second thickness that is greater than the first thickness. An ion well is formed in the substrate within the second device region. The second pad oxide layer is thinned down to a third thickness. The nitride hard mask layer is removed from the first device region. A pad nitride layer is formed on the first pad oxide layer and the second pad oxide layer. A trench isolation structure is formed in the pad nitride layer, the first pad oxide layer, the second pad oxide layer, and the substrate.

According to some embodiments, the first thickness is 90-130 angstroms and the second thickness is 380-420 angstroms.

According to some embodiments, the third thickness is equal to the first thickness.

According to some embodiments, the first device region is a low-voltage device region and the second device region is a medium-voltage device region or a high-voltage device region.

According to some embodiments, the ion well is a P-type well.

According to some embodiments, the method further comprises the step of subjecting the ion well to a thermal drive in process after forming the ion well in the substrate within the second device region.

According to some embodiments, the second pad oxide layer is thinned down to the third thickness by performing a RCA cleaning process.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figures 1, 2:
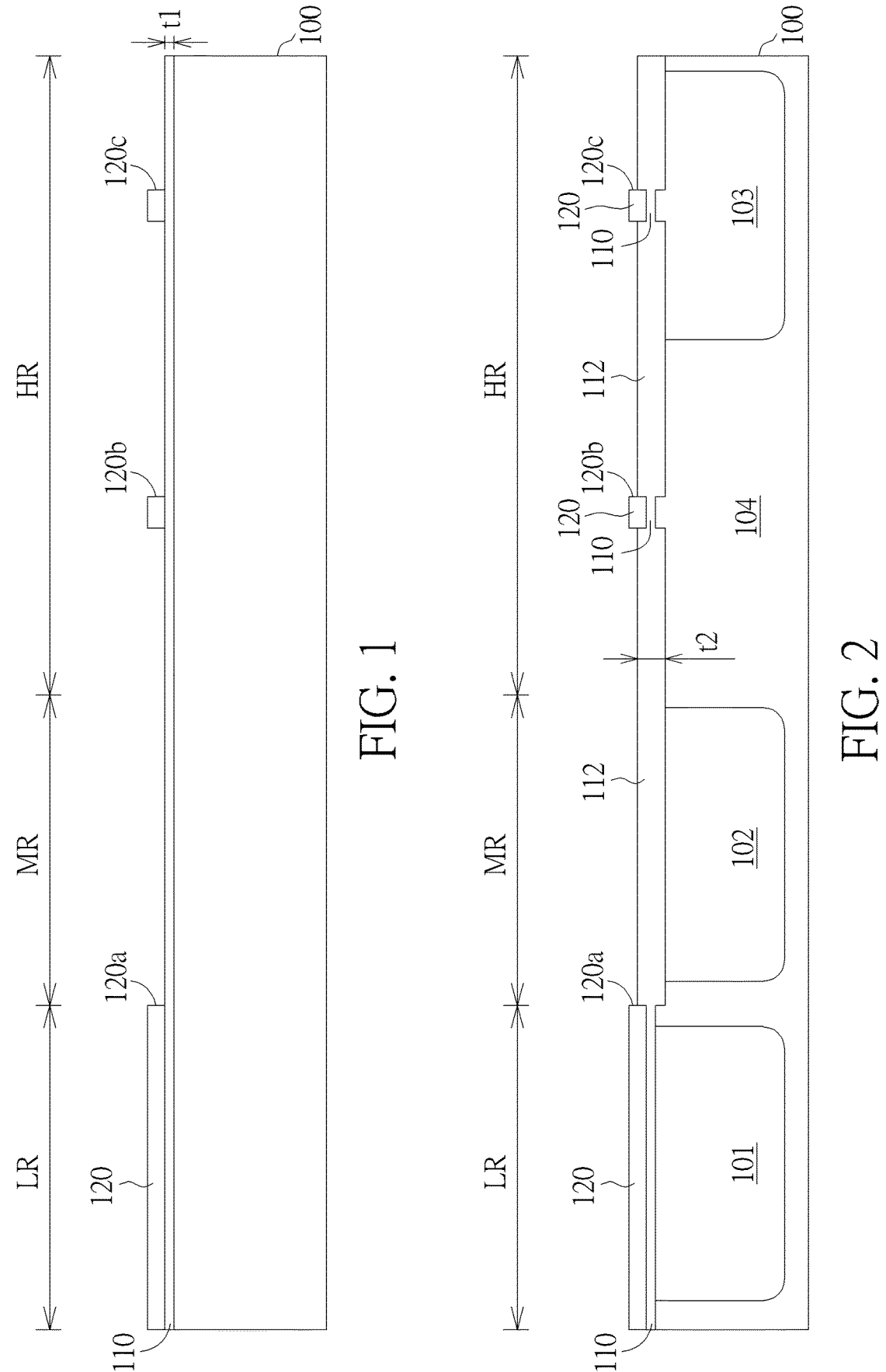
FIG. 1 to FIG. 4 are schematic diagrams of a method of forming a semiconductor structure according to an embodiment of the present invention.

Please refer to FIG. 1 to FIG. 4, which are schematic diagrams of a method of forming a semiconductor structure according to an embodiment of the present invention. As shown in FIG. 1, first, a substrate 100 is provided, for example, a silicon substrate, on which a low-voltage device region LR, a medium-voltage device region MR and a high-voltage device region HR non-overlapping to one another are provided. According to an embodiment of the present invention, the low-voltage device region LR may be contiguous with the medium-voltage device region MR, and the medium-voltage device region MR may be contiguous with the high-voltage device region HR, but is not limited thereto. Next, a thermal oxidation process or a deposition process may be performed to blanket deposit a first pad oxide layer 110, such as a silicon dioxide layer, on the substrate 100 in the low-voltage device region LR, the medium-voltage device region MR, and the high-voltage device region HR. According to an embodiment of the present invention, the first pad oxide layer 110 has a first thickness t1. According to an embodiment of the present invention, for example, the first thickness t1 is 90-130 angstroms.

A chemical vapor deposition (CVD) process is then performed to deposit a nitride hard mask layer 120 on the first pad oxide layer 110. A lithographic process and an etching process are then performed to pattern the nitride hard mask layer 120. Part of the nitride hard mask layer 120 is removed from the medium voltage device region MR and the high voltage device region HR to form openings 120a, 120b and 120c. According to an embodiment of the present invention, for example, the opening 120a of the nitride hard mask layer 120 may span the medium-voltage device region MR and the high-voltage device region HR, while the openings 120b and 120c are located in the high-voltage device region HR. At this point, the first pad oxide layer 110 in the openings 120a, 120b and 120c is exposed.

As shown in FIG. 2, a thermal oxidation process is performed, and a second pad oxide layer 112 is thermally grown on the substrate 100 in the medium-voltage device region MR and the high-voltage device region HR through the openings 120*a*, 120*b* and 120*c*. The second pad oxide layer 112 has a second thickness t2. According to an embodiment of the present invention, the second thickness t2 is greater than the first thickness t1. According to an embodiment of the present invention, for example, the second thickness t2 is 380-420 angstroms.

Next, a photolithography process and an N-type ion implantation process are performed to form a deep N-type well 101, a deep N-type well 102 and a deep N-type well 103 in the substrate 100 in the low-voltage device region LR, the medium-voltage device region MR and the high-voltage device region HR respectively. A photolithography process and a P-type ion implantation process are then performed to form a P-type high-voltage ion well 104 in the substrate 100 in the high-voltage device region HR. According to an embodiment of the present invention, after the P-type high-voltage ion well 104 is formed, the P-type high-voltage ion well 104 may be subjected to a thermal drive-in process.

Figures 3, 4:
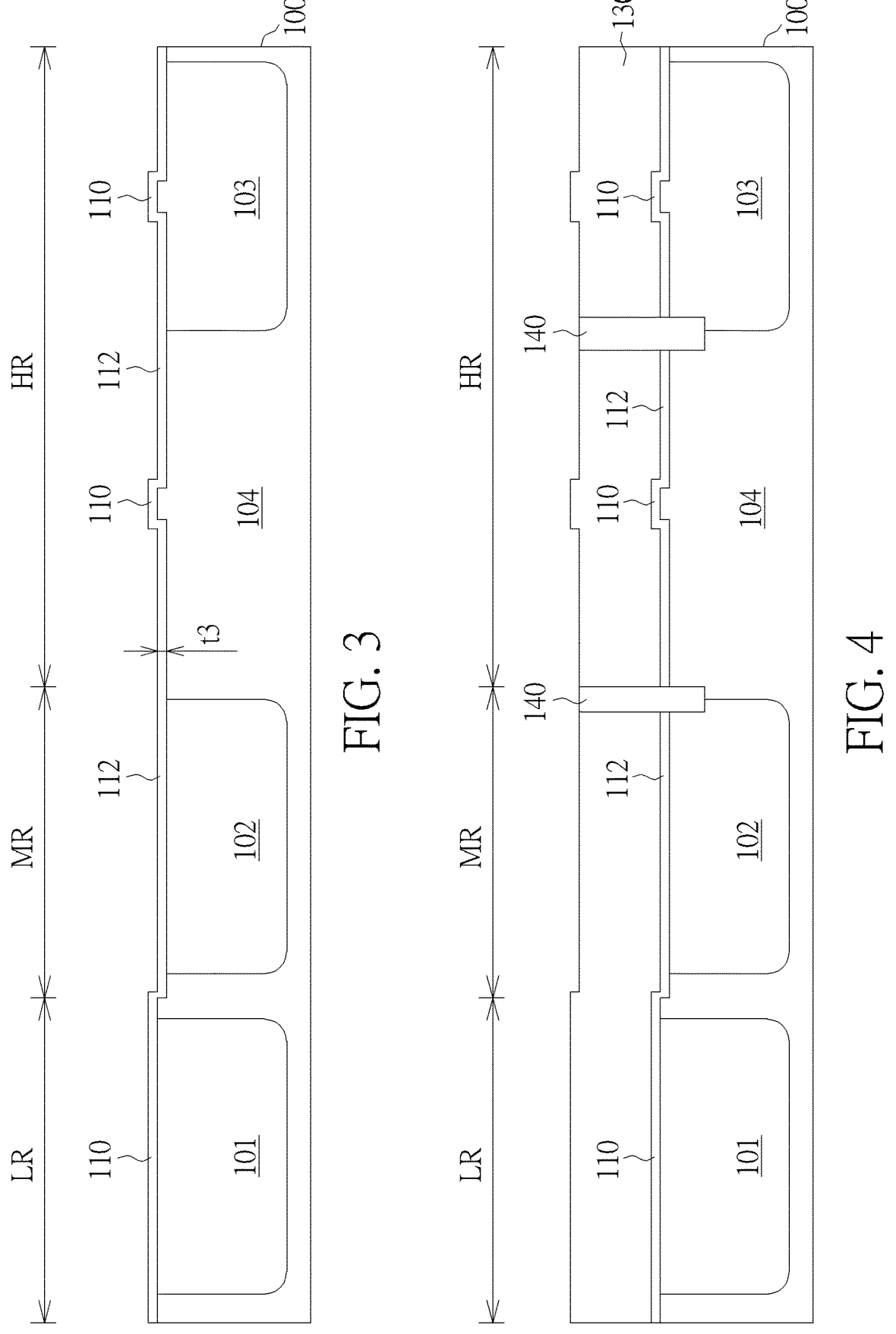

As shown in FIG. 3, an RCA cleaning process is performed to thin the second pad oxide layer 112 to a third thickness t3 through the openings 120*a*, 120*b* and 120*c*. According to an embodiment of the present invention, the third thickness t3 is equal to the first thickness t1. According to an embodiment of the present invention, for example, the third thickness t3 is 90-130 angstroms. The aforementioned RCA cleaning process may include, but is not limited to, an SC-1 cleaning step, an SC-2 cleaning step, and a dilute hydrofluoric acid (DHF) aqueous solution etching step. After completing the RCA cleaning process, the nitride hard mask layer 120 in the low-voltage device region LR is removed.

As shown in FIG. 4, a chemical vapor deposition process is then performed to form a pad nitride layer 130 on the first pad oxide layer 110 and the second pad oxide layer 112. According to an embodiment of the present invention, for example, the pad nitride layer 130 may be a silicon nitride layer. Subsequently, a photolithography process, an etching process, a chemical vapor deposition process, a chemical mechanical polishing process and other steps are performed to form a trench isolation structure 140 in the pad nitride layer 130, the first pad oxide layer 110, the second pad oxide layer 112 and the substrate 100.

One advantage of the present invention is that the thinned second pad oxide layer 112 is used as the pad oxide layer for the subsequent shallow trench isolation process. Therefore, there is no need to remove all the pad oxide layers on the surface of the substrate 100 after the P-type high-voltage ion well thermal drive-in process. Therefore, the subsequent step of re-growing the pad oxide layer can be omitted, thereby simplifying the process complexity.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method for forming a semiconductor structure, comprising:
   providing a substrate having a first device region and a second device region thereon;
   forming a first pad oxide layer on the substrate over the first device region and the second device region, wherein the first pad oxide layer has a first thickness;
   forming a nitride hard mask layer on the first pad oxide layer over the first device region and the second device region;
   removing the nitride hard mask layer from the second device region;
   thermally growing a second pad oxide layer on the substrate within the second device region, wherein the second pad oxide layer has a second thickness that is greater than the first thickness;
   forming an ion well in the substrate within the second device region;
   thinning down the second pad oxide layer to a third thickness;
   removing the nitride hard mask layer from the first device region;
   forming a pad nitride layer on the first pad oxide layer and the second pad oxide layer; and
   forming a trench isolation structure in the pad nitride layer, the first pad oxide layer, the second pad oxide layer, and the substrate.

2. The method for forming a semiconductor structure according to claim 1, wherein the first thickness is 90-130 angstroms and the second thickness is 380-420 angstroms.

3. The method for forming a semiconductor structure according to claim 1, wherein the third thickness is equal to the first thickness.

4. The method for forming a semiconductor structure according to claim 1, wherein the first device region is a low-voltage device region and the second device region is a medium-voltage device region or a high-voltage device region.

5. The method for forming a semiconductor structure according to claim 1, wherein the ion well is a P-type well.

6. The method for forming a semiconductor structure according to claim 1 further comprising:
   subjecting the ion well to a thermal drive in process after forming the ion well in the substrate within the second device region.

7. The method for forming a semiconductor structure according to claim 1, wherein the second pad oxide layer is thinned down to the third thickness by performing a RCA cleaning process.

* * * * *